(12) United States Patent
Sanfilippo et al.

(10) Patent No.: US 8,766,164 B2
(45) Date of Patent: Jul. 1, 2014

(54) GEIGER-MODE PHOTODIODE WITH INTEGRATED AND ADJUSTABLE QUENCHING RESISTOR AND SURROUNDING BIASING CONDUCTOR

(75) Inventors: Delfo Nunziato Sanfilippo, Catania (IT); Massimo Cataldo Mazillo, Corato (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 528 days.

(21) Appl. No.: 12/637,628

(22) Filed: Dec. 14, 2009

(65) Prior Publication Data

US 2010/0148040 A1 Jun. 17, 2010

(30) Foreign Application Priority Data

Dec. 17, 2008 (IT) ..................... 20080945

(51) Int. Cl.
*H01L 31/00* (2006.01)
*H01L 31/107* (2006.01)

(52) U.S. Cl.
USPC ....................... 250/214.1; 257/438

(58) Field of Classification Search
USPC ...................... 250/214.1; 257/438
See application file for complete search history.

(56) References Cited

U.S. PATENT DOCUMENTS

| 4,313,127 A | 1/1982 | Su et al. |
| 4,972,244 A | 11/1990 | Buffet et al. |
| 5,360,987 A | 11/1994 | Shibib |
| 5,367,188 A | 11/1994 | Kudo |
| 5,501,893 A | 3/1996 | Laermer et al. |
| 5,596,186 A | 1/1997 | Kobayashi |

(Continued)

FOREIGN PATENT DOCUMENTS

| DE | 102007037020 | 8/2008 |
| EP | 1596439 | 11/2005 |

(Continued)

OTHER PUBLICATIONS

A. Campisia, L. Cosentino, P. Finocchiaro, A. Pappalardo, F. Musumeci, S. Privitera, A. Scordino, S. Tudisco, G. Fallica, D. Sanfilippo, M. Mazzillo, G. Condorelli, A. Piazza, G. Valvo, S. Lombardo, E. Sciacca, G. Bonanno, M. Belluso, "Multipixel geiger-mode photon detectors for ultra-weak light sources", Nuclear Instruments and Methods in Physics Research A 571 (2007), pp. 350-354.

(Continued)

*Primary Examiner* — Thanh Luu
(74) *Attorney, Agent, or Firm* — Graybeal Jackson LLP (57) ABSTRACT

An embodiment of a Geiger-mode avalanche photodiode includes a body of semiconductor material having a first conductivity type, a first surface and a second surface; a trench extending through the body from the first surface and surrounding an active region; a lateral-isolation region within the trench, formed by a conductive region and an insulating region of dielectric material, the insulating region surrounding the conductive region; an anode region having a second conductivity type, extending within the active region and facing the first surface. The active region forms a cathode region extending between the anode region and the second surface, and defines a quenching resistor. The photodiode has a contact region of conductive material, overlying the first surface and in contact with the conductive region for connection thereof to a circuit biasing the conductive region, thereby a depletion region is formed in the active region around the insulating region.

19 Claims, 6 Drawing Sheets

(56) References Cited

U.S. PATENT DOCUMENTS

| | | | |
|---|---|---|---|
| 6,118,142 | A | 9/2000 | Chen et al. |
| 6,307,244 | B1 | 10/2001 | Shikata |
| 6,437,415 | B1 | 8/2002 | Kuhara et al. |
| 6,541,836 | B2 | 4/2003 | Iwanczyk et al. |
| 6,551,904 | B2 | 4/2003 | Kawahara |
| 6,693,337 | B2 | 2/2004 | Yoneda et al. |
| 6,949,445 | B2 | 9/2005 | Rhodes et al. |
| 6,979,874 | B2 * | 12/2005 | Harada ............. 257/475 |
| 6,995,444 | B2 | 2/2006 | Cova et al. |
| 2001/0017786 | A1 | 8/2001 | Woodward |
| 2002/0139970 | A1 | 10/2002 | Iwanczyk et al. |
| 2007/0020791 | A1 | 1/2007 | Hsu et al. |
| 2007/0045767 | A1 | 3/2007 | Zhu et al. |
| 2008/0121988 | A1 * | 5/2008 | Mallikararjunaswamy et al. ............. 257/328 |
| 2008/0157150 | A1 | 7/2008 | Shim |
| 2008/0191238 | A1 * | 8/2008 | Madathil et al. ............. 257/133 |
| 2008/0308738 | A1 | 12/2008 | Li et al. |
| 2008/0315248 | A1 * | 12/2008 | Tokura et al. ............. 257/139 |
| 2009/0032896 | A1 | 2/2009 | Taniguchi et al. |
| 2009/0057757 | A1 * | 3/2009 | Hokomoto et al. ........... 257/330 |
| 2009/0065826 | A1 | 3/2009 | Hwang |
| 2009/0184317 | A1 | 7/2009 | Sanfilippo et al. |
| 2009/0184384 | A1 | 7/2009 | Sanfilippo et al. |
| 2010/0127314 | A1 | 5/2010 | Frach |
| 2010/0271108 | A1 | 10/2010 | Sanfilippo et al. |
| 2011/0095388 | A1 | 4/2011 | Richter et al. |

FOREIGN PATENT DOCUMENTS

| | | |
|---|---|---|
| EP | 1744366 | 1/2007 |
| EP | 1755171 | 2/2007 |
| RU | 2102821 | 1/1998 |
| WO | WO 2007108456 A1 * | 9/2007 |
| WO | 2008129433 | 10/2008 |
| WO | WO 2008129433 A2 * | 10/2008 |

OTHER PUBLICATIONS

Massimo Mazzillo, Alessandro Piazza, Giovanni Condorelli, Delfo Sanfilippo, Giorgio Fallica, Sergio Billotta, Massimiliano Belluso, Giovanni Bonanno, Luigi Cosentino, Alfio Pappalardo, and Paolo Finocchiaro, "Quantum Detection Efficiency in Geiger Mode Avalanche Photodiodes", IEEE Transactions on Nuclear Science, Vol. 55, No. 6, Dec. 2008, pp. 3620-3625.

F. Zappa, S. Tisa, A. Tosi, S. Cova, "Principles and features of single-photon avalanche diode arrays", Sensors and Actuators A 140 (2007), pp. 103-112.

M. Mazzillo, G. Condorelli, A. Campisi, E. Sciacca, M. Belluso, S. Billotta, D. Sanfilippo, G. Fallica, L. Cosentino, P. Finocchiaro, F. Musumeci, S. Privitera, S. Tudisco, S. Lombardo, E. Rimini, G. Bonanno, "Single photon avalanche photodiodes arrays", Sensors and Actuators A 138 (2007), pp. 306-312.

K. Shimakura, T. Suzuki and Y. Yadoiwa, "Boron and Phosphorus Diffusion Through an SiO2, Layer From a Doped Polycrystalline Si Source Under Various Drive-In Ambients", Solid-State Electronics, 1975, vol. 18, pp. 991-997.

Search Report for Italian Application No. TO20100251, Ministero dello Sviluppo Economico, Nov. 12, 2010, pp. 3.

Italian Search Report for Application No. ITTO20090322, Ministero dello Sviluppo Economico, Nov. 6, 2009, pp. 2.

U.S. Appl. No. 13/070,876, filed Mar. 24, 2011, "Geiger-Mode Avalanche Photodiode With High Signal-To-Noise Ratio, and Corresponding Manufacturing Process".

Search Report based on Italian Patent Application Serial No. TO20080945, Ministero dello Sviluppo Economico, Munich, Nov. 4, 2009, pp. 2.

S. Cova, M. Ghioni, A. Lacaita, C. Samori, and F. Zappa, "Avalanche photodiodes and quenching circuits for single-photon detection", Applied Optics, vol. 35, No. 12, Apr. 20, 1996, pp. 1956-1976.

B. Dolgosheina, V. Balagurab, P. Buzhana, M. Danilovb, L. Filatovd, E. Garuttic, M. Grolle, A. Ilyina, V. Kantserova, V. Kaplina, A. Karakasha, F. Kayumova, S. Klemind, V. Korbelc, H. Meyerc, R. Mizukb, V. Morgunovb, E. Novikovb, P. Pakhlovb, E. Popovaa, V. Rusinovb, F. Sefkowc, E. Tarkovskyb, I. Tikhomirovb, Calice/SiPM Collaboration, "Status report on silicon photomultiplier development and its applications", Nuclear Instruments and Methods in Physics Research A 563 (2006), pp. 368-376.

Claudio Piemonte, "A new Silicon Photomultiplier structure for blue light detection", Nuclear Instruments and Methods in Physics Research A 568 (2006), pp. 224-232.

Z. Sadygova, A. Olshevskia, I. Chirikova, I. Zheleznykhc, A. Novikov, "Three advanced designs of micro-pixel avalanche photodiodes: Their present status, maximum possibilities and limitations", Nuclear Instruments and Methods in Physics Research A 567 (2006), pp. 70-73.

W.J. Kindt, N.H. Shahrjerdy, H.W. van Zeijl, "A silicon avalanche photodiode for single optical photon counting in the Geiger mode", Sensor and Actuators A 60 (1997), pp. 98-102.

D. Renker, " Geinger-mode avalanche photodiodes, history, properties and problems", Nuclear Instruments and Methods in Physics Research A 567 (2006), pp. 48-56.

Emilio Sciacca, Andrea C. Giudice, Delfo Sanfilippo, Franco Zappa, Salvatore Lombardo, Rosario Consentino, Cinzia Di Franco, Massimo Ghioni, Giorgio Fallica, Giovanni Bonanno, Sergio Cova, and Emanuele Rimini, "Silicon Planar Technology for Single-Photon Optical Detectors", IEEE Transactions on Electron Devices, vol. 50, No. 4, Apr. 2003, pp. 918-925.

P. Buzhana, B. Dolgosheina, L. Filatovb, A. Ilyina, V. Kantzerova, V. Kaplina, A. Karakasha, F. Kayumovc, S. Kleminb, E. Popovaa, S. Smirnov, "Silicon photomultiplier and its possible applications", Nuclear Instruments and Methods in Physics Research A 504 (2003) 48-52.

Massimo Ghioni, Angelo Gulinatti, Ivan Rech, Franco Zappa, and Sergio Cova, "Progress in Silicon Single-Photon Avalanche Diodes", IEEE Journal of Selected Topics in Quantum Electronics, vol. 13, No. 4, Jul./Aug. 2007, pp. 852-862.

E. Sciacca, S. Lombardo, M. Mazzillo, G. Condorelli, D. Sanfilippo, A. Contissa, M. Belluso, F. Torrisi, S. Billotta, A. Campisi, L. Cosentino, A. Piazza, G. Fallica, P. Finocchiaro, F. Musumeci, S. Privitera, S. Tudisco, G. Bonanno, and E. Rimini, "Arrays of Geiger Mode Avalanche Photodiodes", IEEE Photonics Technology Letters, vol. 18, No. 15, Aug. 1, 2006, pp. 1633-1635.

J. C. Jackson, D. Phelan, A. P. Morrison, R. M. Redfern and A. Mathewson, "Towards integrated single photon counting microarrays", Optical Engineering, vol. 42, No. 1, Jan. 2003, pp. 112-118.

Cristiano Niclass, Alexis Rochas, Pierre-André Besse, and Edoardo Charbon, "Design and Characterization of a CMOS 3-D Image Sensor Based on Single Photon Avalanche Diodes", IEEE Journal of Solid-State Circuits, vol. 40, No. 9, Sep. 2005, pp. 1847-1854.

Franco Zappa, Angelo Gulinatti, Piera Maccagnani, Simone Tisa, and Sergio Cova, "SPADA: Single-Photon Avalanche Diode Arrays", IEEE Photonics Technology Letters, vol. 17, No. 3, Mar. 2005, pp. 657-659.

Brian F. Aull, Andrew H. Loomis, Douglas J. Young, Richard M. Heinrichs, Bradley J. Felton, Peter J. Daniels, and Deborah J. Landers, "Geiger-Mode Avalanche Photodiodes for Three-Dimensional Imaging", Lincoln Laboratory Journal, vol. 13, No. 2, 2002, pp. 335-350.

Dieter Renker, "Properties of avalanche photodiodes for applications in high energy physics, astrophysics and medical imaging", Nuclear Instruments and Methods in Physics Research A 486 (2002), pp. 164-169.

S. Vasile, P. Gothoskar, R. Farrell and D. Sdrulla, "Photon Detection with High Avalanche Photodiode Arrays", IEEE Transactions on Nuclear Science, vol. 45, No. 3, Jun. 1998, pp. 720-723.

* cited by examiner

GEIGER-MODE PHOTODIODE WITH INTEGRATED AND ADJUSTABLE QUENCHING RESISTOR AND SURROUNDING BIASING CONDUCTOR

PRIORITY CLAIM

The present application claims priority to Italian Patent Application No. TO2008A000945, filed Dec. 17, 2008, which application is incorporated herein by reference in its entirety.

RELATED APPLICATION DATA

The present application is related to U.S. patent application Ser. No. 12/356,445, entitled ARRAY OF MUTUALLY ISOLATED, GEIGER-MODE, AVALANCHE PHOTODIODES AND MANUFACTURING METHOD THEREOF filed Jan. 20, 2009, currently pending; and U.S. patent application Ser. No. 12/356,464, entitled ARRAY OF MUTUALLY INSULATED GEIGER-MODE AVALANCHE PHOTODIODES, AND CORRESPONDING MANUFACTURING PROCESS filed Jan. 20, 2009, currently pending, both of which applications are incorporated herein by reference in their entireties. The present application is also related to U.S. patent application Ser. No. 12/764,888, entitled GEIGER-MODE PHOTODIODE WITH INTEGRATED AND JFET-EFFECT-ADJUSTABLE QUENCHING RESISTOR, PHOTODIODE ARRAY, AND CORRESPONDING MANUFACTURING METHOD filed Apr. 21, 2010; and U.S. patent application Ser. No. 13/070,826, entitled GEIGER-MODE AVALANCHE PHOTODIODE WITH HIGH SIGNAL-TO-NOISE RATIO, AND CORRESPONDING MANUFACTURING PROCESS filed Mar. 24, 2011.

TECHNICAL FIELD

An embodiment of the present disclosure relates to a Geiger-mode photodiode with integrated and adjustable quenching resistor, to a photodiode array, and to the manufacturing method thereof.

BACKGROUND

As is known, in the field of photon-detection techniques, there is a need for devices that enable detection of electromagnetic radiation with high sensitivity, which are thus able to detect an even limited number of photons associated with the electromagnetic radiation.

To this end, so-called avalanche photodiodes (APDs) have been known for some time and typically comprise a junction of P-N type or P-I-N type, an anode contact, and a cathode contact, capable of biasing the junction. In particular, an APD is biased by applying, by an appropriate biasing circuit, a reverse biasing voltage $V_A$ that is very high, but lower (in modulus) than the breakdown voltage $V_B$ of the junction in the APD, thus biasing the junction in the linear region. Given the high reverse biasing voltage $V_A$, the junction has a wide depletion region, subject to a high electric field.

Operatively, given a photon that impinges on an APD, the photon traverses the junction, and in particular traverses the depletion region, where it can be absorbed, generating a corresponding electron-hole pair. If the photon is absorbed, the electron and the hole thus created, referred to, as a whole, as "carriers", are accelerated by the electric field in opposite directions, with consequent generation of a current indicating the absorption having occurred. Since the APD is biased in the linear region, the current is proportional to the number of photons absorbed, thus to the number of photons that impinge on the APD. In addition, given the high electric field, the acceleration is such that the carriers acquire kinetic energies sufficient to cause generation of further electron-hole pairs by atomic ionization by impact, i.e., irrespective of the absorption of photons. Each carrier created after absorption of a single photon may thus generate one or more electron-hole pairs, with consequent multiplication of the absorption current and generation of an avalanche current. The avalanche current is appropriately collected, for example, through external circuitry, at the anode and cathode contacts, and represents an output signal of the APD.

It is noted that, to be precise, the reverse biasing voltage $V_A$ applied to the APD coincides with the effective voltage $V_e$ present across the junction only in the absence of photons. In fact, in the presence of photons, and thus of current generated within the APD, the effective voltage $V_e$ across the junction may be lower, in modulus, than the reverse biasing voltage $V_A$, as described hereinafter in greater detail. However, in the present document it is assumed, except where otherwise explicitly specified, that the effective voltage $V_e$ across the junction coincides with the reverse biasing voltage $V_A$.

The most widely available APDs comprise a P-I-N junction, capable of guaranteeing a depletion region that is wider than the one obtainable with a P-N junction, and moreover comprise an additional region of semiconductor material, which is slightly doped, either of P- or N-type. This additional region is arranged in such a way that the electric field inside it is particularly high so as to favor the process of atomic ionization by impact.

In detail, the APD comprises a structure formed by semiconductor regions that follow one another according to a P-N-I-N scheme, or else a N-P-I-P scheme, the additional region being thus arranged between the intrinsic region I, which is at most only slightly doped, and the region of the P-I-N junction having a conductivity of an opposite type with respect to the conductivity of the additional region. On the basis of the physical phenomena that occur therein, the additional region is also known as "multiplication area" in so far as it is the site of the phenomena of ionization by impact, while the intrinsic region is also known as "absorption area", since the majority of the photons are absorbed therein.

APD photodetectors of the type described, also known as "separate absorption and multiplication avalanche photodiodes" (SAM APDs), make it possible to achieve gains, i.e., amplifications of the current generated by absorption of a photon, of the order of $10^2$. However, on account of noise and of noise amplification, APD photodetectors do not enable detection of individual photons.

In order to improve responsivity further, so-called "Geiger-mode avalanche photodiodes" have been proposed, which are theoretically able to detect individual photons.

A Geiger-mode avalanche photodiode, also known as single-photon avalanche diode (SPAD), is biased by applying a reverse biasing voltage $V_A$ higher in amplitude than the breakdown voltage $V_B$, typically higher by 10-20%, so that a single electron-hole pair, generated by absorption of a photon, is sufficient to trigger a ionization process that causes an avalanche multiplication of the carriers, with gains of around $10^6$ and consequent generation in short times (hundreds of picoseconds) of the avalanche current.

The gain and the likelihood of detection of a photon, i.e., the responsivity of the SPAD, are directly proportional to the reverse biasing voltage $V_A$ applied to the SPAD. In fact, the more the reverse biasing voltage $V_A$ exceeds the amplitude of the breakdown voltage, the higher the likelihood of occurrence of an avalanche generation of charge carriers.

However, high reverse biasing voltages $V_A$ mean that, even in the absence of incident photons (dark conditions), a single charge carrier, generated, for example, by transfer of thermal energy, is sufficient to trigger the avalanche-ionization process, generating the so-called "dark current", which interferes negatively with normal use of the SPAD.

In addition, the fact that the reverse biasing voltage $V_A$ is appreciably higher than the breakdown voltage $V_B$ causes the avalanche-ionization process, once triggered, to be self-supporting. Consequently, once triggered, the SPAD is no longer able to detect photons, with the consequence that, in the absence of appropriate remedies, the SPADs described manage to detect arrival of a first photon, but not arrival of subsequent photons.

In order to be able to also detect these subsequent photons, it is necessary to quench the avalanche current generated within the SPAD, stopping the avalanche-ionization process. In detail, it is necessary to reduce, for a period of time known as "hold-off time", the effective voltage $V_e$ across the junction so as to inhibit the ionization process and quench the avalanche current, as described hereinafter. Subsequently, the initial junction-biasing conditions are reset so that the SPAD is again able to detect photons. Since during the hold-off time the SPAD is not able to detect photons, it is desirable for the hold-off time to be as short as possible.

In order to reduce the effective voltage $V_e$ across the junction after absorption of a photon, the SPADs adopt so-called "quenching circuits".

Among others, quenching circuits of a passive type are known in the art, comprising a quenching resistor arranged in series with the junction and having a resistance of the order of hundreds of kiloohms.

In the absence of photons, the presence of the quenching resistor does not alter the effective voltage $V_e$ across the junction, which is equal to the reverse biasing voltage $V_A$. However, after absorption of a photon and consequent triggering of the ionization process, the avalanche current that is triggered thereby, by flowing in the quenching resistor, causes an exponential reduction in the amplitude of the effective voltage $V_e$ across the junction, which drops until it is slightly higher than the breakdown voltage $V_B$. As regards, instead, the avalanche current generated within the SPAD, it passes from a zero value to a peak value substantially immediately after triggering of the avalanche-ionization process (turning-on of the SPAD), then decreases exponentially towards an asymptotic value, inversely proportional to the resistance of the quenching resistor and directly proportional to the difference between the reverse biasing voltage $V_A$ applied of the SPAD and the breakdown voltage $V_B$, said difference being generally known as "overvoltage" (OV).

In detail, it is possible to show that the avalanche-ionization process is stopped if the value of the avalanche current drops below a threshold value known as "latching current" $I_L$. Consequently, a quenching resistor having a resistance equal to $R_q$ is able to quench the avalanche current for an overvoltage equal at most to the product $R_q \cdot I_L$, i.e., for a reverse biasing voltages $V_A$ not higher than $V_B + R_q \cdot I_L$. If these conditions are respected, the avalanche current is quenched. Then, the SPAD, the behavior whereof is to a certain extent comparable to that of a capacitor, recharges exponentially through the quenching resistor so that the effective voltage $V_e$ across the junction returns to being equal to the reverse biasing voltage $V_A$, the SPAD being thus ready to detect the arrival of a new photon. During the recharging time, i.e., in the time interval in which the effective voltage $V_e$ increases exponentially until it returns equal to the reverse biasing voltage $V_A$, the SPAD has a reduced responsivity, which increases as the effective voltage $V_e$ increases.

On the basis of the above, it may be inferred that applications that are particularly demanding in terms of responsivity typically require high overvoltages OV, thus high reverse biasing voltages $V_A$, with the consequence that the quenching resistor has a high value; otherwise, it might be impossible to quench the avalanche current and, thus, to detect more photons.

High quenching resistance entails a longer recharging time than lower resistance. On the other hand, it leads to an additional advantage. In fact, during the recharging time the SPAD is less sensitive to the arrival of the photons, but is also less sensitive to spurious pulses ("afterpulsing"), which usually degrade the performance of the SPADs. In detail, afterpulsing consists of the secondary emission of carriers due to lattice defects in the depletion region, which create intermediate energy levels (comprised between the conduction band and the valence band) that are able to capture one or more carriers of the avalanche current, then releasing them with unpredictable delays, causing an increase in the dark current and distorting the output signal of the SPAD.

On the basis of the above, the quenching resistors are sized in the design stage according to the reverse biasing voltage $V_A$ to be applied to the SPAD, which in turn depends upon the application intended for the SPAD, and in particular upon the responsivity and upon the quantum efficiency required. In addition, the resistance of the quenching resistor is sized as a function of the recharging times and of the sensitivity to afterpulsing specified by the application for which the SPAD is devised. For example, where the rate of arrival of the photons is predictably low, as, for example, in astrophysical applications, the quenching resistor is sized with a high resistance so as to limit the afterpulsing, the consequent increase in the recharging time not being particularly important in this type of application.

SPADs of a known type may thus be optimized for a specific application; consequently, their performance may fall off markedly when they are used in conditions that are not perfectly in compliance with the design conditions.

Similar considerations may be made for so-called SPAD arrays, and moreover for so-called silicon photomultipliers (SiPMs), used in order to improve the performance that may be obtained with individual SPADs.

In particular, an array of SPADs, two examples whereof are shown in Italian Patent Application Nos. TO2008A000046 and TO2008A000045 filed on Jan. 18, 2008, and which are incorporated by reference, is simply formed by a planar matrix of SPADs grown on a same substrate.

A SiPM is a particular array of SPAD. In detail, the SiPM is formed by a matrix of SPADs grown on a same substrate and provided with respective quenching resistors, of a vertical type and integrated in the SPADs, the quenching resistors being uncoupled from, and independent of, one another. In addition, the anode and cathode contacts of each SPAD are configured to be coupled to a single voltage source. Consequently, the SPADs of the SiPM can be biased at a same reverse biasing voltage $V_A$. In addition, the avalanche currents generated inside them are multiplied together so as to generate an output signal of the SiPM equal to the sum of the output signals of the SPADs. As regards the terminology, in the technical field of SiPMs it is common to refer to the ensemble photodiode-quenching resistor as "pixel", the SiPM being thus formed by an array of pixels.

The SiPM is thus a device with a large area and high gain, capable of supplying, on average, an electric output signal (current) proportional to the number of photons that impinge on the SiPM. In fact, since the quenching resistors are uncoupled from one another, each photodiode of the SiPM behaves as an independent binary counter, while the output signal of the SiPM is proportional to the number of pixels activated, i.e., to the number of SPADs in which the avalanche-ionization process (detection of a photon) has been triggered, this number being in turn proportional to the number of incident photons.

As has been indicated, notwithstanding the better performance provided by SiPMs, these also may undergo improvement as to versatility of use.

SUMMARY

An embodiment of the present disclosure is a Geiger-mode avalanche photodiode solving at least in part the drawbacks of the known art.

BRIEF DESCRIPTION OF THE DRAWINGS

For a better understanding of the disclosure, one or more embodiments thereof are now described, purely by way of non-limiting example and with reference to the attached drawings, wherein.

DETAILED DESCRIPTION

Figure 1:
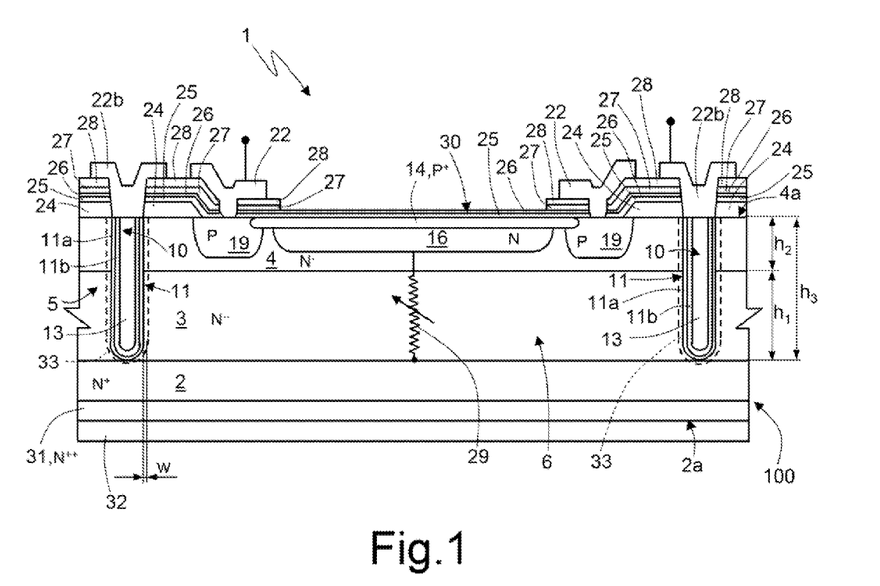
FIG. 1 shows a cross-section of an embodiment of a photodiode.
Figure 2:
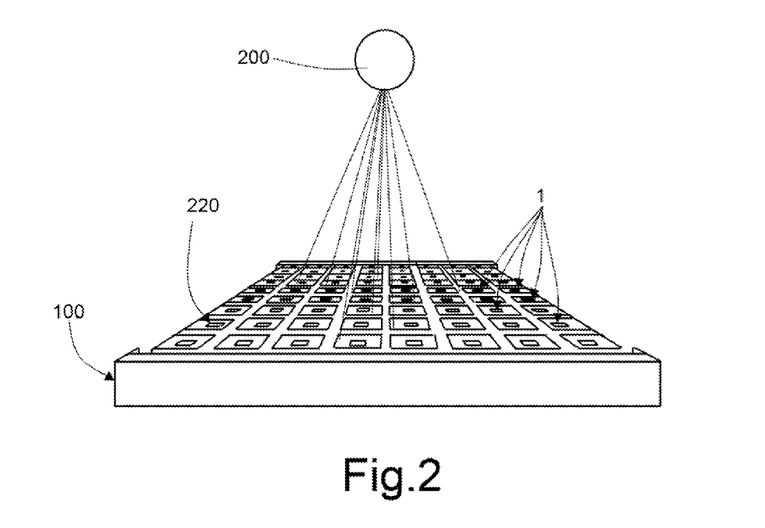
FIG. 2 is a schematic illustration of an embodiment of a photodiode array during use.

FIG. 1 shows an embodiment of a photodiode 1 of the avalanche type and operating in Geiger mode. The photodiode 1 may belong, for example, to an array 220 of photodiodes 1, as illustrated in FIG. 2, which shows also an external light source 200. The array 220 may comprise any number of photodiodes 1, according to the application.

Returning to FIG. 1, the photodiode 1 is integrated in a chip 100, including a substrate 2, of an N+ type and having a bottom surface 2a. In addition, the photodiode 1 includes a first epitaxial layer 3, of an N− type, having a thickness $h_1$ of approximately 50 μm and overlying the substrate 2, in direct contact therewith; and a second epitaxial layer 4, of an N− type, having a thickness $h_2$ of approximately 5 μm and a top surface 4a, overlying the first epitaxial layer 3, in direct contact therewith. The substrate 2, the first and the second epitaxial layers 3, 4 form in practice a body 5 of semiconductor material. The doping level of the substrate 2 is greater by at least three orders of magnitude, preferably five, than the doping level of the first epitaxial layer 3; the difference between the doping levels of the first and second epitaxial layers 3, 4 is, instead, of approximately two orders of magnitude.

A lateral-isolation region 10, of a circular or polygonal shape in top plan view, extends vertically with a depth $h_3$ at least equal to the sum of the thicknesses $h_1$, $h_2$ of the epitaxial layers 3, 4 so as to delimit and insulate portions of the body 5 each forming an active region 6 housing a single photodiode 1. In practice, each photodiode 1 of the array 220 is insulated from the adjacent photodiodes 1 by the lateral-isolation region 10.

The lateral-isolation region 10 comprises a channel-stopper region 11, arranged more externally, of dielectric material, for example oxide, in direct contact with the substrate 2, the first epitaxial layer 3, and the second epitaxial layer 4; and a metal region 13, for example of tungsten, which fills, and is surrounded by, the channel-stopper region 11, and is in direct electrical contact with a gate metal region 22b.

The channel-stopper region 11 is formed by a double layer including a thin coating layer 11a, for example of thermal oxide, arranged more externally, and a thick coating layer 11b, for example of TEOS, arranged more internally. The thickness of the thin coating layer 11a is 15-25 nm, while the thickness of the thick coating layer 11b is of the order of a few hundreds of nanometers.

An anode region 14, of a P+ type and of a circular or quadrangular shape, extends within the second epitaxial layer 4, facing the top surface 4a.

An enriched region 16, of an N type, extends in the second epitaxial layer 4, underneath, and in direct contact with, the anode region 14. The enriched region 16 and the second epitaxial layer 4 have the purpose of confining a high electric field in proximity of the P-N junction formed by the anode region 14 and the enriched region 16.

A circular guard ring 19, of a P type, extends in the second epitaxial layer 4, facing the top surface 4a, externally and contiguous to the anode region 14. The guard ring 19 forms a PN diode with the second epitaxial layer 4 so as to prevent edge breakdown of the anode region 14. In addition, the guard ring 19 is in direct electrical contact with an anode metal region 22.

It may be noted that the types of the anode region 14 and of the guard ring 19, and thus the corresponding doping levels, are such that the depletion region that is present across the interface between regions of P type (anode region 14 and guard ring 19) and regions of N type (enriched region 16 and second epitaxial layer 4) extends principally in the guard ring 19, rather than in the anode region 14, preventing, at the interface between the anode region 14 (semiconductor) and the oxide layers present above the anode region 14 (described hereinafter), localization of a high electric field, thus reducing the dark current of the photodiode 1. In fact, this interface is rich in Shockley-Read-Hall (SRH) centers, and it is thus expedient to limit the electric fields in its proximity; otherwise, there may be an undesirable increase of the dark current of the photodiode 1.

A first dielectric layer 24 extends on a peripheral region of the top surface 4a, laterally staggered with respect to the anode region 14.

A second dielectric layer 25, for example of TEOS oxide, extends over the top surface 4a, on the first dielectric layer 24, on the anode region 14 and (partially, except for the contact with the anode metal region 22) on the guard ring 19. A coating layer 26, for example of nitride, extends over the second dielectric layer 25 and provides, together with the latter, a double anti-reflection coating (DLARC) 30.

By appropriately modulating, in a per se known manner, the thickness of the second dielectric layer 25 and of the coating layer 26, it is possible to optimize the anti-reflection coating 30 so that it is transparent only for a specific range of wavelengths and reflecting for the wavelengths falling outside the range. It is thus possible to provide photodiodes 1 that are sensitive only to some frequencies of the light spectrum.

A third dielectric layer 27 (which forms a single layer with the thick coating layer 11b) and a fourth dielectric layer 28 extend over the coating layer 26, laterally staggered with respect to the anode region 14. However, as above indicated, the gate metal region 22b extends on the lateral-isolation region 10, traverses the dielectric layers 24-28 and is electrically coupled to the metal region 13.

A cathode contact region 31, of an N++ type, extends within the substrate 2 and faces the bottom surface 2a. The cathode contact region 31 is moreover in direct contact with a cathode metal region 32, of metal, which extends underneath the bottom surface 2a of the substrate 2.

The enriched region 16, the second epitaxial layer 4, the first epitaxial layer 3, the substrate 2, and the cathode contact region 31 form a cathode region. Within the cathode region, the first and second epitaxial layers 3, 4 form a vertical integrated quenching resistor 29, electrically coupled between the anode region 14 and the substrate 2, and quench the avalanche current generated after absorption of a photon. In this structure, the voltage drop in the substrate 2, of an N+ type, is negligible on account of the low resistivity of the substrate 2. In addition, the resistance of the quenching resistor 29 is determined, to a first approximation, by the first epitaxial layer 3 alone, which is of an N− type, due to the considerably higher resistivity than the second epitaxial layer 4, of an N− type, and the greater thickness.

In detail, due to the arrangement of the anode metal region 22 and cathode metal region 32, and the presence of the channel stopper 11 of dielectric material, the avalanche current is forced to flow vertically in the active region 6 delimited by the lateral-isolation region 10, traversing the quenching resistor 29. The value of the electrical resistance of the quenching resistor 29 is determined by the area A of the pixel (photodiode 1 plus quenching resistor 29), i.e., by the area of the active region 6, this area depending upon the shape of the lateral-isolation region 10, and, to a first approximation, upon the thickness $h_1$ of the first epitaxial layer 3.

Consequently, the resistance presented by the quenching resistor 29 to the avalanche current is approximately equal to $\rho \cdot l/A$, where $\rho$ is the resistivity of the first epitaxial layer 3, and $l$ is the thickness $h_1$ of the first epitaxial layer 3.

For example, for the photodiode 1 illustrated in FIG. 1, and assuming an area A of 400 $\mu m^2$ and a resistivity $\rho=80$ $\Omega \cdot cm$ for the first epitaxial layer 3, a resistance of 100 k$\Omega$ is obtained. Thus, assuming a latching current of 20 $\mu A$, it follows that the quenching resistor 29 described is able to quench the avalanche current in the case of overvoltages OV of at most about 2 V.

If the resistance is not sufficient in relation to the type of use and of biasing envisaged for the photodiode 1, it is possible to increase the resistance by decreasing the area A of the pixel.

To this end, the gate metal region 22b may be arranged in contact with an external gate biasing circuit, configured for supplying a gate biasing voltage $V_G$, so as to apply a negative voltage to the metal region 13 contained in the lateral-isolation region 10. By so doing, around the lateral-isolation region 10 a depletion region 33 is created, which extends in the body 5 of semiconductor material, in particular in the first epitaxial layer 3, and in direct contact with the channel stopper 11. In fact, the metal region 13, the channel stopper 11 and the first and second epitaxial layers 3, 4, and possibly also the substrate 2, when the lateral-isolation region 10 extends beyond the first and second epitaxial layers 3, 4 ($h_3 > h_1 + h_2$), form a MOS system. Consequently, the application of a negative gate biasing voltage $V_G$ to the metal region 13 causes the formation of the high-resistivity depletion region 33 accommodating positively charged donors, but without free charges.

Due to the absence of free charges, the avalanche current substantially cannot flow in the depletion region 33. Consequently, the area A is reduced with respect to the value assumed in the absence of gate biasing $V_G$. In addition, the thickness w of the depletion region 33 may be varied by modulating the gate biasing voltage $V_G$ applied to the metal region 13. In particular, by increasing, in absolute value, the gate biasing voltage $V_G$, the thickness w of the depletion region 33 increases, and thus the resistance of the quenching resistor 29 increases. Consequently, it becomes possible to apply to the photodiode 1 higher overvoltages OV, and thus higher reverse biasing voltages $V_A$, thus improving the responsivity and quantum efficiency of the photodiode 1. It is further noted that the possibility of varying the resistance of the quenching resistor 29 may be obtained independently from the prevention of the edge breakdown of the anode region 14, this latter advantage being obtained by means of the PN diode formed by the guard ring 19 and the second epitaxial layer 4.

Application of a negative gate biasing voltage $V_G$ moreover enables compensation of the effects induced by the presence, at the interface between the body 5 and the channel stopper 11, of positive fixed charges.

In detail, due to the low doping level of the first epitaxial layer 3, the presence of the positive fixed charges causes, in the absence of a gate biasing voltage $V_G$, an accumulation of electrons at the interface between the body 5 and the channel stopper 11 of the lateral-isolation region 10. The accumulation of electrons creates a low-resistivity region that is not controllable and that may form a preferential path for the avalanche current, reducing the level of overvoltage OV that may be applied to the photodiode 1. The application of a negative gate biasing voltage $V_G$ moves the electrons away and aids in preventing the phenomenon described.

From a practical standpoint, in addition to functioning as a gate of a MOSFET that controls the resistance of the quenching resistor 29, the metal region 13 enables optical isolation of the photodiodes 1 of the array 220. In addition, the oxide in the channel stopper 11 provides electrical isolation between the photodiodes 1 of the array 220, so that the quenching resistors 29 become independent of one another. In other words, the lateral-isolation region 10 enables limitation of the negative effects on the photodiode 1 induced by charge carriers (for example, electrons) generated by adjacent photodiodes, and by photons generated by electroluminescence during the avalanche multiplication in adjacent photodiodes, this effects being known, respectively, as "electric crosstalk" and "optical crosstalk".

It is, moreover, noted that, since the lateral-isolation region 10 extends as far as and possibly beyond the substrate 2, and due to the low resistivity of the substrate 2, each pixel of the array 220 is uncoupled from the other pixels. In fact, the avalanche current produces a voltage drop in the substrate 2 of a negligible amount, with the consequence that turning-on of a photodiode 1 does not alter biasing of the adjacent photodiodes 1, leaving the effective voltage V, across the junctions of the adjacent photodiodes 1 unaltered.

Consequently, the array 220 of photodiodes 1 provides a semiconductor photomultiplier of the SiPM type, in which all photodiodes 1 work in substantially the same operating conditions.

The photodiodes 1 of FIG. 1 are manufactured using an embodiment described hereinafter and represented in FIGS. 3-11.

Initially (FIG. 3), the first epitaxial layer 3, of an N− type (doped with phosphorus) and with doping level of approximately $5.5 \cdot 10^{13}$ cm$^{-3}$ (equivalent resistivity of approximately 80 $\Omega \cdot cm$), is grown on the substrate 2, of an N+ type (doped with phosphorus) and with doping level of approximately $10^{19}$ cm$^{-3}$. Next, the second epitaxial layer 4 is grown, of an N− type (doped with phosphorus) and having doping level of approximately $5 \cdot 10^{15}$ cm$^{-3}$ (equivalent resistivity of approximately 1 Ω·cm). For example, the substrate 2 may have a thickness of approximately 500 μm, while the first and second epitaxial layers 3, 4 may have, respectively, thicknesses of approximately 50 μm and 5 μm.

Figure 3:
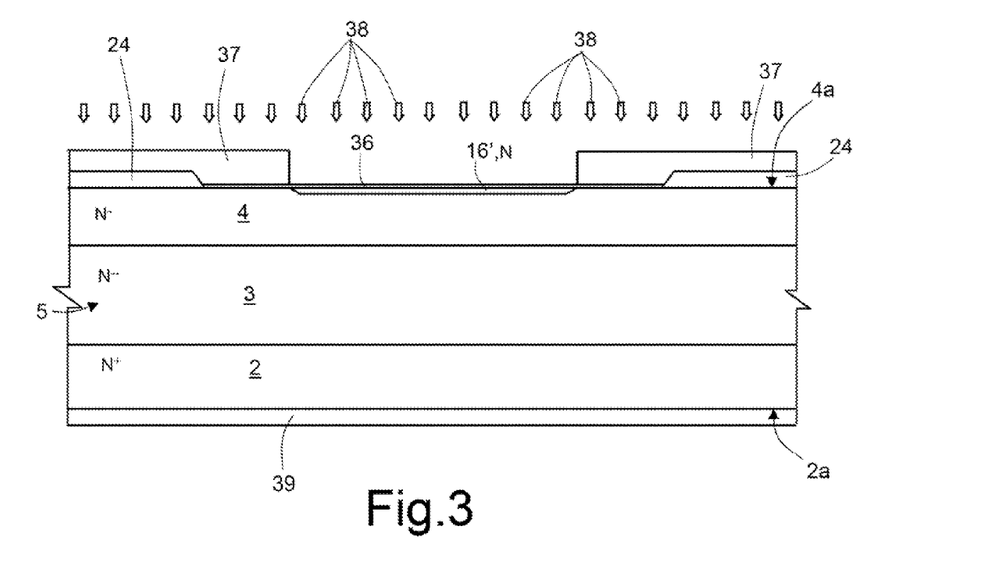
FIGS. 3-11 show cross-sections of an embodiment of a photodiode during successive manufacturing steps.
Figure 4:
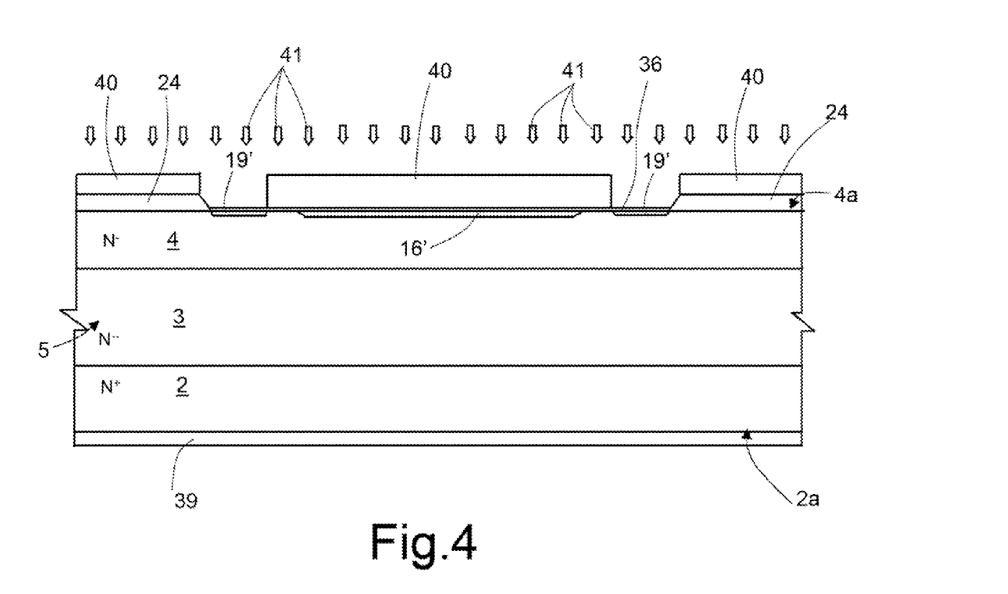
Figure 5:
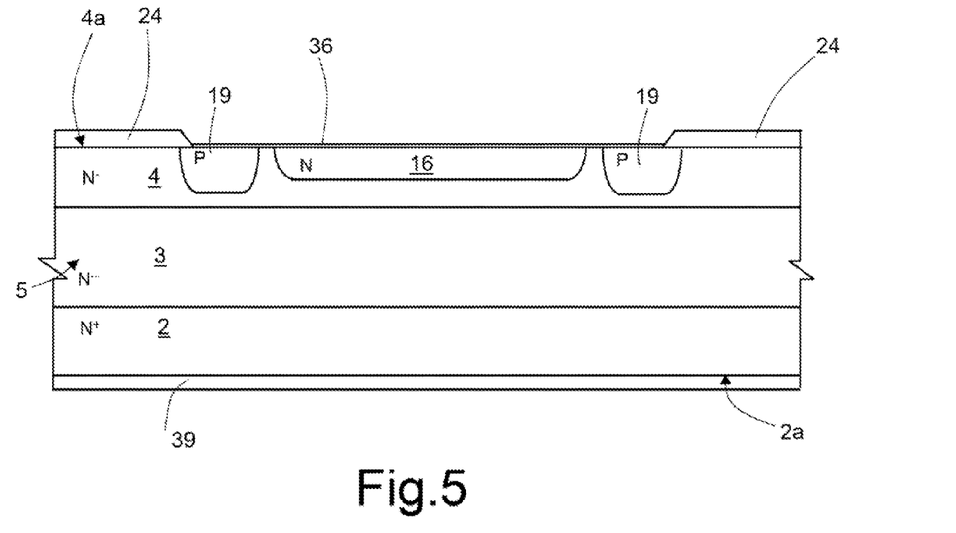
Figure 6:
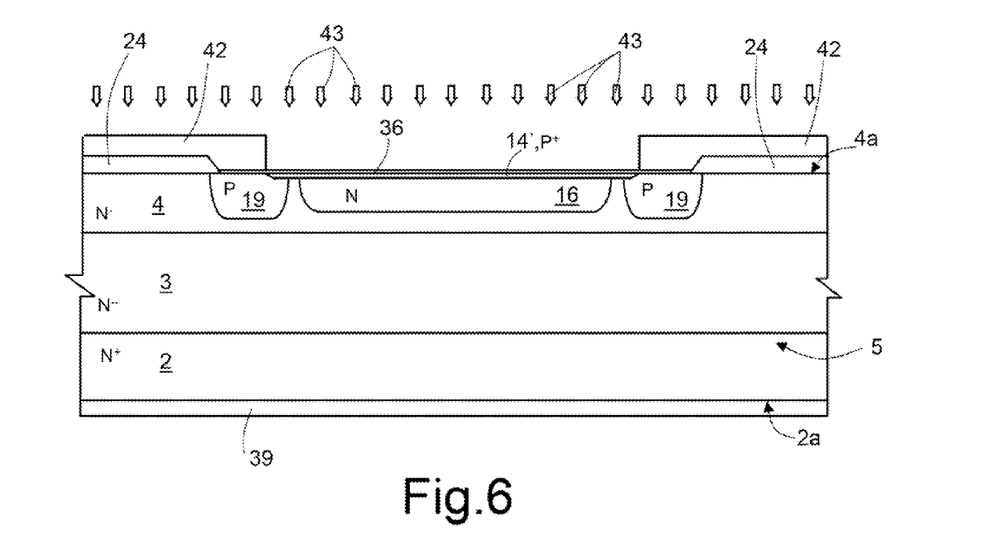

Next, the first dielectric layer 24, for example of oxide, is first grown by thermal oxidation on the second epitaxial layer 4, and then selectively removed by photolithography and wet chemical etching where the anode regions 14 are to be formed. In the framework of the oxidation process, a bottom layer 39 of thermal oxide is also grown underneath the bottom surface 2a.

Next, a new thermal oxidation, followed by a new removal by photolithography and chemical etching, enables formation, in a per se known manner, of alignment marks, not shown in FIG. 3. The chemical etching is, for example, a wet etch, since it prevents damage to the crystal lattice of the second epitaxial layer 4 and reduces the introduction of undesirable contaminating particles in the second epitaxial layer 4.

In order to prevent, during the subsequent steps of doping by implantation, metal impurities from contaminating the second epitaxial layer 4, a first protective layer 36, for example of thermal oxide, is grown on the second epitaxial layer 4.

Then, in order to reduce the contamination of sites external to the region where the enriched region 16 is to be implanted, a first resist mask 37 is used.

Then a low-energy implantation (20-40 keV) of dopant species of an N type (for example, phosphorus atoms), is carried out, as represented by the arrows 38, in the second epitaxial layer 4 so as to localize the dopant species in a first thin layer 16' arranged underneath the protective layer 36 and intended to form the enriched region 16 at the end of suitable thermal treatments, as explained hereinafter.

Then (FIG. 4), after removal of the first resist mask 37, a second resist mask 40 is formed so as to define the region where the guard ring 19 is to be formed. An implantation at low energy (20-40 keV) of dopant species of a P type (for example, boron atoms), represented by the arrows 41, is then made in the second epitaxial layer 4, so as to localize the dopant species in a second thin layer 19' extending underneath the protective layer 36, at a distance from the first thin layer 16'.

Next (FIG. 5), the second resist mask 40 is removed, and a thermal annealing is carried out, for example, at temperatures higher than about 1000° C., and for a duration of about a few hours so as to reduce the sites of the second epitaxial layer 4 damaged by ion implantation and so as to activate the dopant species, thus forming the enriched region 16 of an N type, facing the top surface 4a, and the guard ring 19 of a P type, also facing the top surface 4a. At the end of thermal annealing, the peak doping level in the enriched region 16 is approximately $5 \cdot 10^{16}$ cm$^{-3}$, i.e., an order of magnitude higher than the doping level of the second epitaxial layer 4; the peak doping level of the guard ring 19 is, instead, approximately $10^{16}$ cm$^{-3}$.

Then (FIG. 6), a third resist mask 42 is provided so as to define the region where the anode region 14 is to be formed, and then an implantation at low energy (5-10 keV) of dopant species of a P type (represented by the arrows 43) is made in the second epitaxial layer 4 so as to localize the dopant species in a third thin layer 14' underneath the protective layer 36.

Next (FIG. 7), the third resist mask 42 is removed, and, by wet etching, the protective layer 36 possibly remaining after the above indicated implantation processes is removed. Then, for example using the chemical-vapor-deposition (CVD) technique, the second dielectric layer 25, for example of oxide, and the coating layer 26, for example of nitride, are deposited, thus providing the antireflection coating 30.

Figure 7:
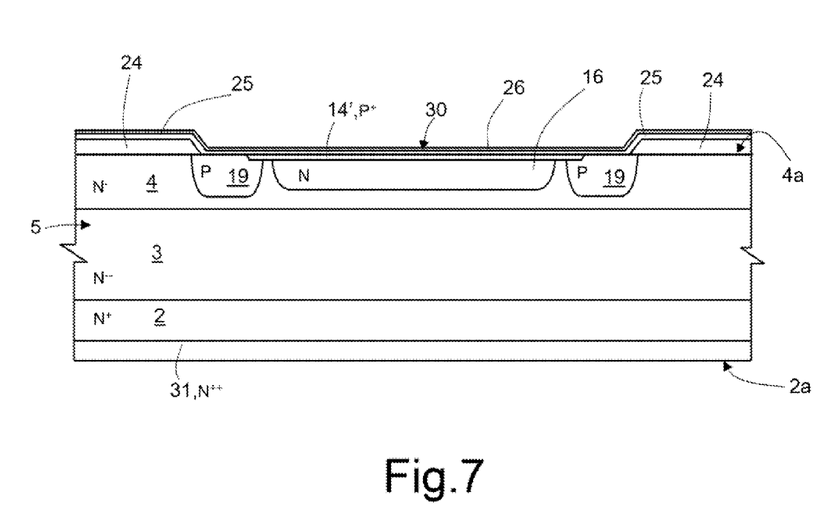
Figure 8:
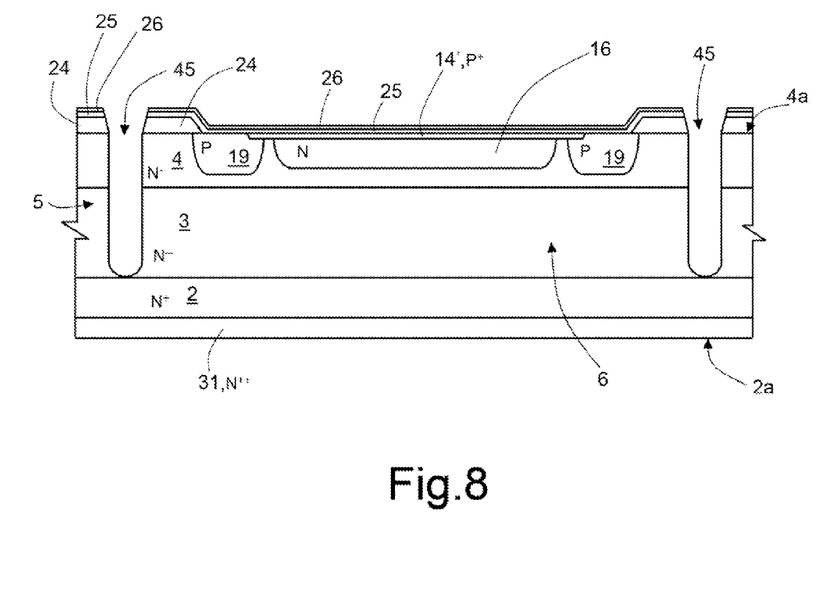

Then the bottom, thermal-oxide, layer 39 is removed by dry etching and dopant species of an N type are implanted with high dosage ($5 \cdot 10^{15}$ cm$^{-2}$) and high energy (1 MeV) on the bottom surface 2a of the substrate 2 in order to form the cathode contact region 31, of an N++ type. It may be noted that, as described hereinafter, the high-doping implantation represents also the first step of a gettering process, having the purpose of minimizing the lattice defects within photodiode 1.

Next (FIG. 8), the lateral-isolation region 10 is formed, having a shape that is, for example, circular, quadrangular or, in general, polygonal, of a width of approximately 1 μm and a depth greater than or equal to 55 μm, thus characterized by a high aspect ratio, i.e., a high depth-to-width ratio. To this end, photolithography is carried out, followed by etching, based upon repeated cycles of passivation and etching carried out in an fluorine rich environment so as to enable the formation of markedly vertical trenches 45 (anisotropic etching).

Next (FIG. 9), the thin coating layer 11a, of thermal oxide with a thickness of about 15-25 nm, is grown and then a dielectric layer is deposited, for example by CVD, so as to form both the thick coating layer 11b and the third dielectric layer 27. The dielectric layer may, for example, be a TEOS oxide and have a thickness of about 50 to 200 nm, thus providing the channel stopper 11.

Figure 9:
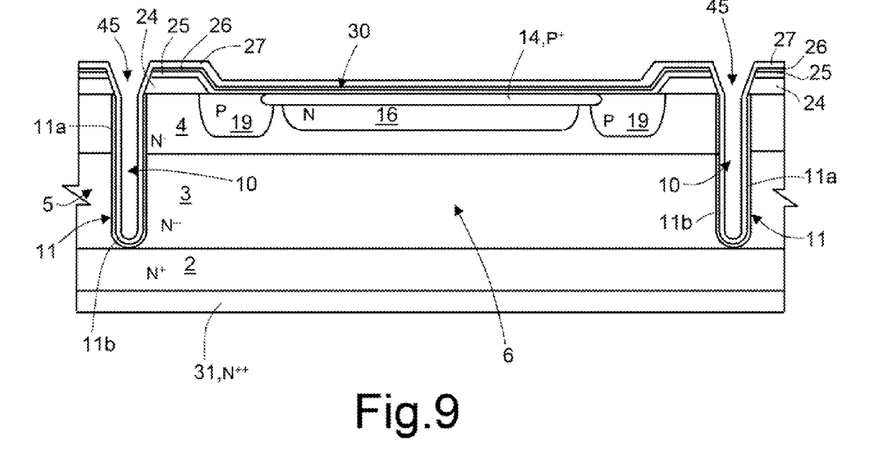

It is noted that the thin coating layer 11a coats only the internal edges and the bottom of the trench 45 in so far as the thermal oxide cannot grow above the coating layer 26, which is of nitride. Consequently, on the top surface 4a, in addition to the aforesaid first and second dielectric layers 24, 25 and to the coating layer 26, only the third dielectric layer 27 is added.

The thermal growth of the thin coating layer 11a requires an amount of heat, which is usefully employed also for activating the dopant species implanted in the third thin layer 14', and for obtaining the anode region 14, of a P+ type and with peak doping level of approximately $10^{19}$ cm$^{-3}$.

Thermal annealing is then carried out at a moderate temperature (700° C.) for a few hours ("segregation annealing"). The step of segregation annealing has the purpose of causing the metal impurities present in the active region 6 due to the implantation to diffuse and agglomerate at the gettering sites, i.e., in the proximity of the cathode contact region 31, where lattice defects due to the implantation are present, so as to reduce the lattice imperfections in the active area 6 and improve the performance of the photodiode 1 in terms of dark current and afterpulsing.

Figure 10:
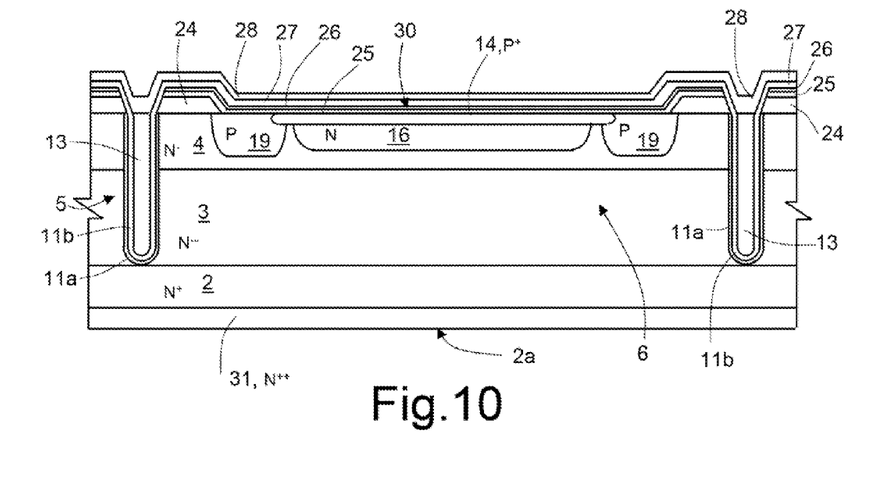

Next, as shown in FIG. 10, the trench 45 is filled by depositing metal, for example tungsten, forming the metal region 13. After the metal deposition, an etch is carried out, for example, a dry etch, for removing the metal portion deposited on the top surface 4a. Next, the fourth dielectric layer 28 is deposited, for example of TEOS oxide so as to electrically insulate the metal region 13 (temporarily).

Figure 11:
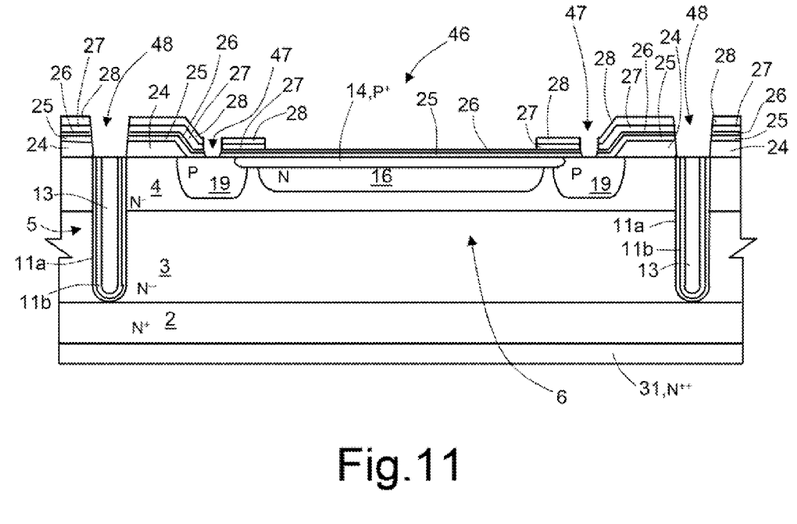

Next, as illustrated in FIG. 11, photolithography and dry etching are carried out in order to remove selectively:
  portions of the third and fourth dielectric layers 27, 28, so as to form a first window 46, extending over the enriched region 16 and over the anode region 14 so as to expose the anti-reflection-coating region 30, which, in use, enables the passage of photons impinging on the photodiode 1 towards the active region 6; and a second window 47, on the guard ring 19 and on corresponding portions of the second dielectric layer 25 and of the coating layer 26;

a portion of the fourth dielectric layer 28 so as to form a third window 48, extending above the trenches 45, for the formation of the gate metal region 22b. It is noted that, in case of more photodiodes 1, belonging, for example, to the array 220, the fourth dielectric layer 28 may not be removed at one or more photodiodes 1 so to form structures that do not allow an adjustment of the respective quenching resistor 29, but are useful in the testing of the array 220, to verify proper operation of the other photodiodes 1.

Next, a further photolithography and wet etching are carried out so as to remove selectively the portions of the second dielectric layer 25 and of the coating layer 26 underlying the second window 47, for forming the anode metal region 22.

Next, the anode metal region 22 and gate metal region 22b are formed through deposition by sputtering of metal material and photolithography. Then, the cathode metal region 32 is formed by depositing further metal material on the bottom surface 2a of the substrate 2, using sputtering, thus obtaining the structure of FIG. 1.

Figure 12:
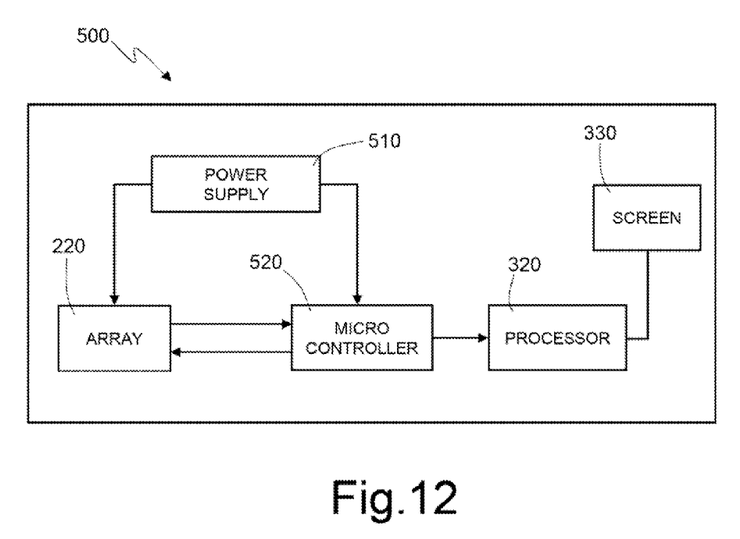
FIG. 12 shows a system that uses an embodiment of the photodiode array.

Finally, a sintering process is carried out at a low temperature and in hydrogen-based environment in order to passivate possible dangling bonds at the interface between oxide regions and silicon regions. The array 220 of photodiodes 1 may be used in a generic system 500 shown in FIG. 12, wherein a power supply 510 supplies at least one array 220 of photodiodes 1 and at least one microcontroller 520 coupled to the array 220. The microcontroller 520 processes the output signal of the array 220 of photodiodes 1, and supplies a processed signal to a processor 320, which enables analysis of the processed signal and display of the information associated with said processed signal on a screen 330.

Finally, it is evident that modifications and variations may be made to the photodiode and to the method described, without thereby departing from the scope of the present disclosure.

For example, the substrate 2 and the body 5 may be of an opposite type, and the position of the cathode contact region 31 and of the anode region 14, as likewise of the respective metal regions 32, 22, may be reversed.

Likewise embodiments are possible wherein the body 5 does not comprise the second epitaxial layer 4 and/or the guard ring 19. If no guard ring 19 is provided, then the anode region 14 and the enriched region 16 may extend laterally until they directly contact the channel-stopper region 11.

Likewise, the channel stopper 11 may be formed by a single layer of insulating material. Also possible are embodiments wherein the body 5 does not comprise the enriched region 16.

As regards the manufacturing method, the lateral-isolation region 10 may be formed at a different point of the manufacturing method described, for example, before depositing the second dielectric layer 25 and the coating layer 26, or else in an intermediate step while forming the regions 16, 19, 14 in the second epitaxial layer 4.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A diode, comprising:
semiconductor region having first and second opposite surfaces and having first, second, and third layers, each layer having a different doping level such that the first layer has a doping level that is less than the second doping level and greater than the third doping level;
an anode of the diode disposed in the first layer of the semiconductor region adjacent to the first surface;
a cathode of the diode disposed in the second layer of the semiconductor region adjacent to the second surface;
an impedance disposed in the third layer of the semiconductor region between the anode and the cathode;
a conductive gate disposed in the semiconductor region adjacent to the impedance; and
a gate insulator disposed in the semiconductor region between the impedance and the gate.

2. The diode of claim 1 wherein the anode is contiguous with the first surface.

3. The diode of claim 1 wherein the impedance comprises a resistance.

4. The diode of claim 1 wherein:
the impedance comprises a side that is approximately perpendicular to the first surface of the semiconductor region;
the gate is disposed around at least a portion of the impedance adjacent to the side of the impedance.

5. The diode of claim 1 wherein the gate comprises a metal.

6. The diode of claim 1, further comprising an enriched region disposed in the semiconductor region between the anode and the impedance.

7. The diode of claim 1, further comprising a cathode contact disposed in the semiconductor region between the cathode and the second surface.

8. The diode of claim 1, further comprising a cathode electrode disposed over the second surface of the semiconductor region.

9. A diode, comprising:
semiconductor region having first and second opposite surfaces;
an anode disposed in the semiconductor region adjacent to the first surface;
a cathode disposed in the semiconductor region adjacent to the second surface;
an impedance disposed in the semiconductor region between the anode and the cathode;
a conductive gate disposed in the semiconductor region adjacent to the impedance; and
a gate insulator disposed in the semiconductor region between the impedance and the gate;
wherein:
the semiconductor region comprises a first donor type epitaxial layer having a first doping level, a second donor type epitaxial layer having a second doping level that is lower than the first doping level, and a donor type substrate having a third doping level that is higher than the first doping level;
the anode is disposed in the first layer;
the impedance is disposed in the second layer; and
the cathode is disposed in the substrate.

10. A diode, comprising:
semiconductor region having first and second opposite surfaces;
an anode disposed in the semiconductor region adjacent to the first surface;
a cathode disposed in the semiconductor region adjacent to the second surface;
an impedance disposed in the semiconductor region between the anode and the cathode;
a conductive gate disposed in the semiconductor region adjacent to the impedance; and a gate insulator disposed in the semiconductor region between the impedance and the gate;

wherein:

the semiconductor region comprises a first donor type epitaxial layer having a first doping level, a second donor type epitaxial layer having a second doping level that is lower than the first doping level, and a donor type substrate having a third doping level that is higher than the first doping level;

the anode is disposed in the first layer;

the impedance is disposed in the first and second layers; and the cathode is disposed in the substrate.

11. A diode, comprising:

semiconductor region having first and second opposite surfaces;

an anode disposed in the semiconductor region adjacent to the first surface;

a cathode disposed in the semiconductor region adjacent to the second surface;

an impedance disposed in the semiconductor region between the anode and the cathode;

a conductive gate disposed in the semiconductor region adjacent to the impedance; and a gate insulator disposed in the semiconductor region between the impedance and the gate;

wherein the anode has a side that is approximately perpendicular to the first surface of the semiconductor region; and wherein a guard ring disposed around at least a portion of the anode adjacent to the side.

12. A diode, comprising:

semiconductor region having first and second opposite surfaces;

an anode disposed in the semiconductor region adjacent to the first surface;

a cathode disposed in the semiconductor region adjacent to the second surface;

an impedance disposed in the semiconductor region between the anode and the cathode;

a conductive gate disposed in the semiconductor region adjacent to the impedance; and a gate insulator disposed in the semiconductor region between the impedance and the gate;

the diode further comprising a wavelength selective coating disposed over the first surface of the semiconductor region.

13. A diode, comprising:

semiconductor region having first and second opposite surfaces;

an anode of the diode disposed in a portion of the semiconductor region having a first conductivity and adjacent to the first surface;

a cathode of the diode disposed in a portion of in the semiconductor region having a second conductivity that is greater than the first conductivity and adjacent to the second surface;

an impedance disposed in a portion of the semiconductor region having a third conductivity that is less than the first conductivity and between the anode and the cathode;

a conductive gate disposed in the semiconductor region, the conductive gate having a first portion disposed adjacent to the impedance and having a second portion; and a gate insulator disposed in the semiconductor region between the impedance and the first portion of the conductive gate.

14. The diode of claim 13 wherein the anode is contiguous with the first surface.

15. The diode of claim 13 wherein:

the semiconductor region comprises first, second, and third layers;

the anode is disposed in the first layer;

the impedance is disposed in the second layer; and the cathode is disposed in the third layer.

16. The diode of claim 13 wherein the first portion of the conductive gate comprises a vertical portion that penetrates into the semiconductor layer.

17. The diode of claim 13 wherein the second portion of the conductive gate comprises a contact portion that is disposed over the semiconductor layer.

18. The diode of claim 13 wherein the conductive gate comprises tungsten.

19. The diode of claim 13 wherein the first portion of the conductive gate is surrounded by an oxide coating layer.

* * * * *